(12) United States Patent
Akimoto et al.

(10) Patent No.: US 6,432,842 B2
(45) Date of Patent: Aug. 13, 2002

(54) COATING METHOD AND COATING APPARATUS

(75) Inventors: Masami Akimoto, Kikuchi-gun; Yoichi Deguchi, Tokyo, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/812,549

(22) Filed: Mar. 21, 2001

(30) Foreign Application Priority Data

Mar. 30, 2000 (JP) ........................................ 2000-094879

(51) Int. Cl.⁷ ...................... H01L 21/31; H01L 21/469; B05C 5/00; B05C 9/08
(52) U.S. Cl. ...................... 438/781; 438/780; 438/782; 118/600; 118/612; 118/320
(58) Field of Search ................................ 438/780, 781, 438/782; 118/600, 612, 320

(56) References Cited

U.S. PATENT DOCUMENTS

| | | | | |
|---|---|---|---|---|
| 5,470,604 A | * | 11/1995 | Neoh | 427/8 |
| 5,773,081 A | * | 6/1998 | Williamitis et al. | 427/211 |
| 5,814,152 A | * | 9/1998 | Thaler | 118/641 |
| 5,851,291 A | * | 12/1998 | Poterola et al. | 118/612 |
| 6,077,792 A | * | 6/2000 | Farrar | 438/780 |
| 6,217,658 B1 | * | 4/2001 | Orczyk et al. | 118/697 |

\* cited by examiner

*Primary Examiner*—Alexander G. Ghyka
(74) *Attorney, Agent, or Firm*—Oblon, Spivak, McClelland, Maier & Neustadt, P.C.

(57) ABSTRACT

A closed space is formed in a reduced pressure drying station, and the closed space is brought to a vacuum state. In this state, an EB unit irradiates a wafer mounted on a hot plate with an electron beam to foam an insulating film material. Subsequently, the hot plate is raised to a predetermined temperature, and drying processing is performed under a reduced pressure. As described above, since the foaming processing is performed in the reduced pressure drying station, bubbles remain in the insulating film, so that the existence of the bubbles can decrease the relative dielectric constant.

11 Claims, 11 Drawing Sheets

COATING METHOD AND COATING APPARATUS

CROSS-REFERENCE TO RELATED APPLICATIONS

This application is based upon and claims the benefit of priority from the prior Japanese Patent Application No. 2000-094879, filed on Mar. 30, 2000, the entire contents of which are incorporated herein by reference.

BACKGROUND OF THE INVENTION

The present invention relates to a coating method and a coating apparatus each for applying an insulating material onto, for example, a substrate such as a semiconductor wafer or the like.

In a field of LSI, there has been a great demand for high-density mounting, and thus wiring conditions have become increasingly challenging. A higher wiring density leads to an increase in capacitance between wirings, manifesting a drop in signal transmitting speed. Delay in signal transmitting speed is proportional to the square root of the product of the wiring resistance and the electrostatic capacitance of the wiring, and the delay is a dominant factor in interfering with the rapid response of the entire device.

To avoid such delay, for example, it is conceivable to arrange properly the design of the wiring pattern or to increase the film thickness of a layer insulating film between wirings in different layers, but it is more typical to use a material with a small relative dielectric constant for a layer insulating film between wirings in the same layer.

However, such avoidance of the delay in signal transmitting speed only by selecting material has a limit, and thus proposal of a new avoiding technique is desired in consideration of progress still to come in high-density mounting.

BRIEF SUMMARY OF THE INVENTION

An object of the present invention is to provide a new technology capable of further decreasing a relative dielectric constant of a layer insulating film.

To solve the aforesaid problems, the first aspect of the present invention is a coating method comprising the steps of: (a) applying an insulating film material onto a substrate; (b) foaming under a reduced pressure the insulating film material applied on the substrate; and (c) drying the insulating film material with the insulating film material foamed.

The second aspect of the present invention is a coating method comprising the steps of: (a) applying an insulating film material onto a substrate; and (b) drying the substrate coated with the insulating film material while ultrasound is supplied to the insulating film material applied on the substrate.

The third aspect of the present invention is a coating method comprising the steps of: (a) applying an insulating film material onto a substrate; (b) drying the substrate coated with the insulating film material to a degree at which fluidity of the insulating film material is kept to some extent while ultrasound is supplied to the insulating film material applied on the substrate; and (c) turning over and drying the substrate after the step (b).

The fourth aspect of the present invention is a coating apparatus comprising: a first processing chamber including a hold and rotation mechanism for rotating a substrate while holding it, and a supply mechanism for supplying an insulating film material onto the substrate held by the hold and rotation mechanism; a foaming mechanism for foaming under a reduced pressure the insulating film material supplied on the substrate; a second processing chamber for drying the insulating film material on the substrate; and a transport mechanism for transporting the substrate from the first processing chamber to the second processing chamber.

The fifth aspect of the present invention is a coating apparatus comprising: a first processing chamber including a hold and rotation mechanism for rotating a substrate while holding it, and a supply mechanism for supplying an insulating film material onto the substrate held by the hold and rotation mechanism; a second processing chamber for drying the substrate under a reduced pressure while ultrasound is supplied to the insulating film material on the substrate; and a transport mechanism for transporting the substrate from the first processing chamber to the second processing chamber.

In the present invention, vacuum bubbles remain in the insulating film, thereby decreasing the relative dielectric constant.

Additional Objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiments of the present invention will be explained with reference to the drawings.

Figure 1:
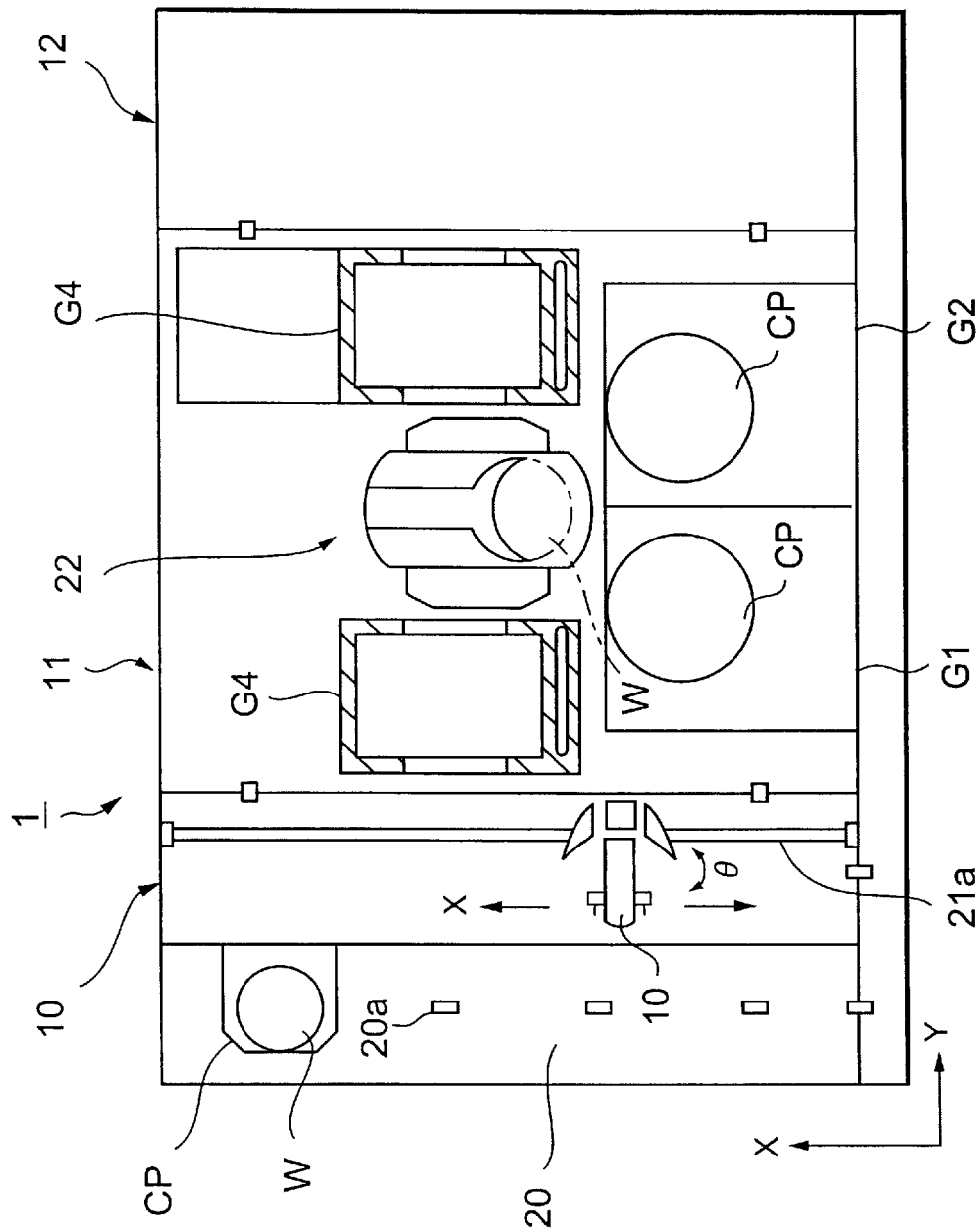
FIG. 1 is a plan view of an SOD processing system according to an embodiment of the present invention.
Figure 2:
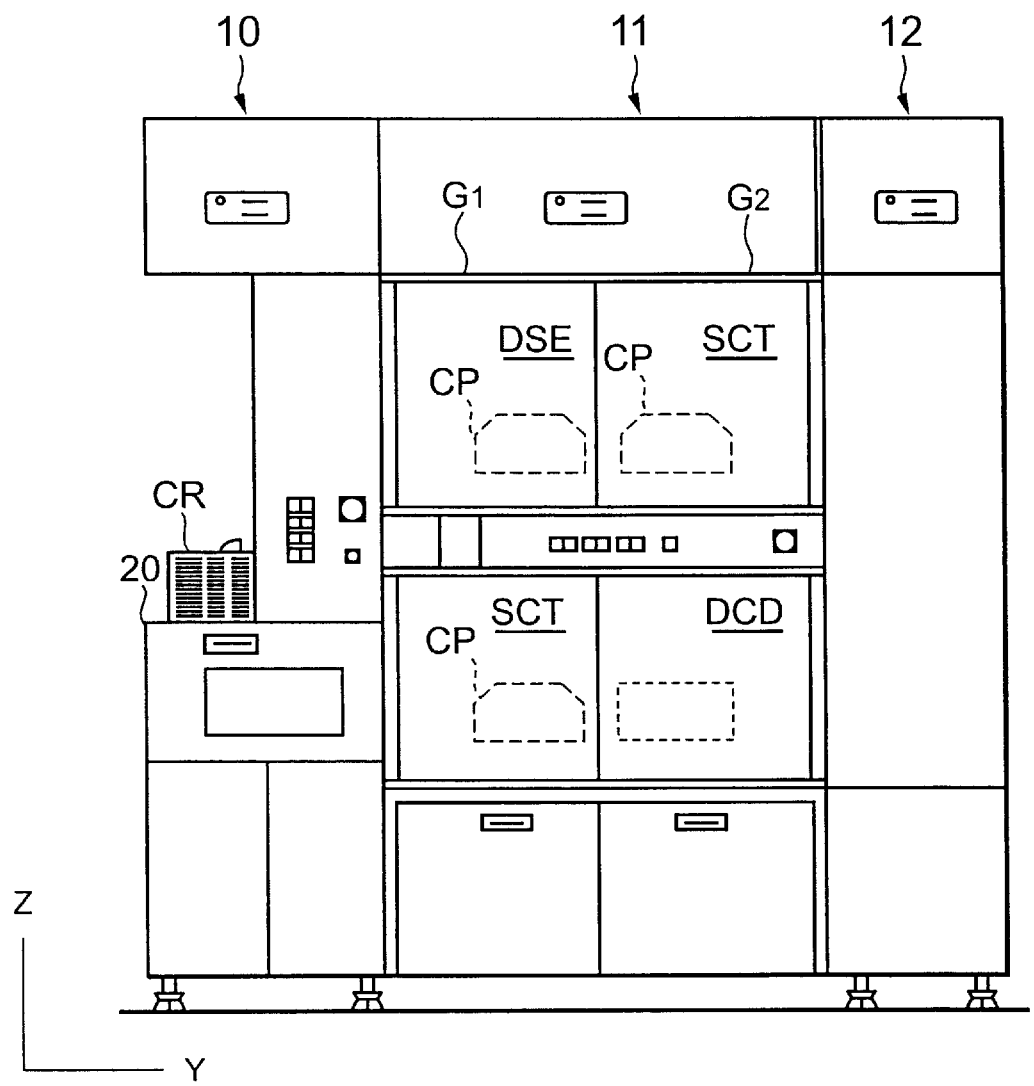
FIG. 2 is a front view of the SOD system processing shown in FIG. 1.
Figure 3:
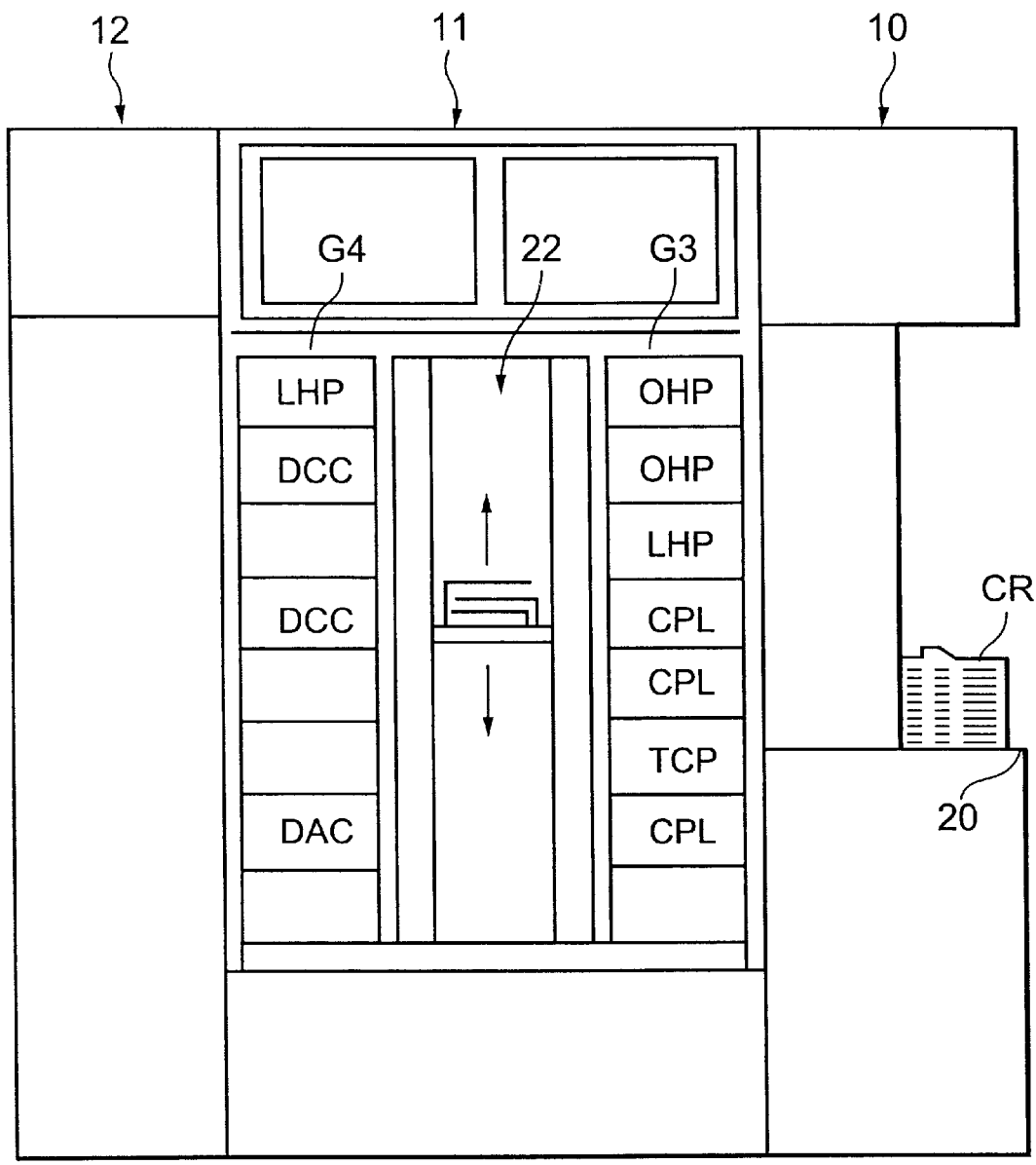
FIG. 3 is a rear view of the SOD processing system shown in FIG. 1.

FIG. 1 to FIG. 3 are views showing the entire configuration of an SOD processing system according to an embodiment of the present invention, FIG. 1 is a plan view, FIG. 2 is a front view, and FIG. 3 is a rear view.

An SOD processing system 1 has a configuration in which, a cassette block 10 for carrying a plurality of, for example, 25 semiconductor wafers (hereinafter, referred to as "wafers") W as substrates, as a unit, per wafer cassette CR from/to the outside into/out of the system and for carrying the wafer W into/out of the wafer cassette CR, a processing block 11 composed of various kinds of processing stations multi-tiered at predetermined positions for performing predetermined processing for the wafers W one by one in an SOD coating step, and a cabinet 12 provided therein with an ammonium water bottle, a bubbler, a drain bottle and the like required in an aging step, are integrally connected.

In the cassette block 10, as shown in FIG. 1, a plurality of, for example, up to four wafer cassettes CR are mounted at positions of projections 20a on a cassette mounting table 20 in a line in an X-direction with the respective wafer transfer ports facing the processing block 11 side, so that a wafer carrier 21 movable in a direction of arrangement of cassettes (the X-direction) and in a direction of arrangement of wafers (a Z-vertical direction) housed in the wafer cassette CR selectively gets access to each wafer cassette CR. The wafer carrier 21 is configured to be further rotatable in a θ-direction so as to get access also to a transfer and cooling plate (TCP) included in a multi-tiered station portion of a third group G3 on the processing block 11 side as described later.

In the processing block 11, as shown in FIG. 1, a vertical-transport type main wafer transport mechanism 22 as a transporter is provided at the center thereof, and all the processing stations are arranged multi-tiered in one group or in a plurality of groups therearound. This embodiment has a multi-tiered configuration of four groups G1, G2, G3, and G4, multi-tiered stations of the first and second groups G1 and G2 are disposed side by side on the front side of the system (this side in FIG. 1), multi-tiered stations of the third group G3 are disposed adjacent to the cassette block 10, and multi-tiered stations of the fourth group G4 are disposed adjacent to the cabinet 12.

As shown in FIG. 2, in the first group G1, an SOD coating processing station (SCT) for supplying an insulating film material with the wafer W mounted on a spin chuck and for rotating the wafer in a cup CP to thereby apply uniformly the insulating film material onto the wafer, and a solvent exchange processing station (DSE) for supplying an exchange chemical, for example, HMDS, heptane, and the like with the wafer W mounted on a spin chuck in a cup CP to thereby perform processing of exchanging a solvent in the insulating film applied on the wafer for another solvent prior to a drying step, are two-tiered from the bottom in order.

In the second group G2, a reduced pressure drying station (DCD) for foaming and drying under a reduced pressure the insulating film material applied on the wafer W in the SOD coating processing station (SCT), and an SOD coating processing station (SCT) are two-tiered from the bottom in order.

As shown in FIG. 3, in the third group G3, two low oxygen and high temperature heat processing stations (OHP), a low temperature heat processing station (LHP), two cooling processing stations (CPL), a transfer and cooling plate (TCP), and a cooling processing station (CPL) are multi-tiered from the top in order. The low oxygen and high temperature heat processing station (OHP) here, including a hot plate on which the wafer W is mounted in a tightly closable processing chamber, performs high temperature heat processing for the wafer W in a low oxygen atmosphere by exhausting gas from the center of the top of the processing chamber while uniformly discharging $N_2$ from holes at the outer periphery of the hot plate. The low temperature heat processing station (LHP), including a hot plate on which the wafer W is mounted, performs low temperature heat processing for the wafer W. The cooling processing station (CPL), including a cooling plate on which the wafer W is mounted, performs cooling processing for the wafer W. The transfer and cooling plate (TCP) is formed in two-tiered structure having a cooling plate for cooling the wafer W at the lower tier and a transfer table at the upper tier to transfer the wafer W between the cassette block 10 and the processing block 11.

In the fourth group G4, a low temperature heat processing station (LHP), two low oxygen cure and cooling processing stations (DCC), and an aging processing station (DAC) are multi-tiered from the top in order. The low oxygen cure and cooling processing station (DCC) here, including a hot plate and a cooling plate to be adjacent to each other in a tightly closable processing chamber, performs high temperature heat processing and performs cooling processing for the wafer W which has been subjected to the heat processing in an $N_2$-exchanged low oxygen atmosphere. The aging processing station (DAC) introduces into a tightly closable processing chamber a processing gas, for example, ($NH_3$+ $H_2O$) made by mixing ammonia gas and water vapor to perform aging processing for the wafer W to thereby wet-gelatinize the insulating film material on the wafer W.

Figure 4:
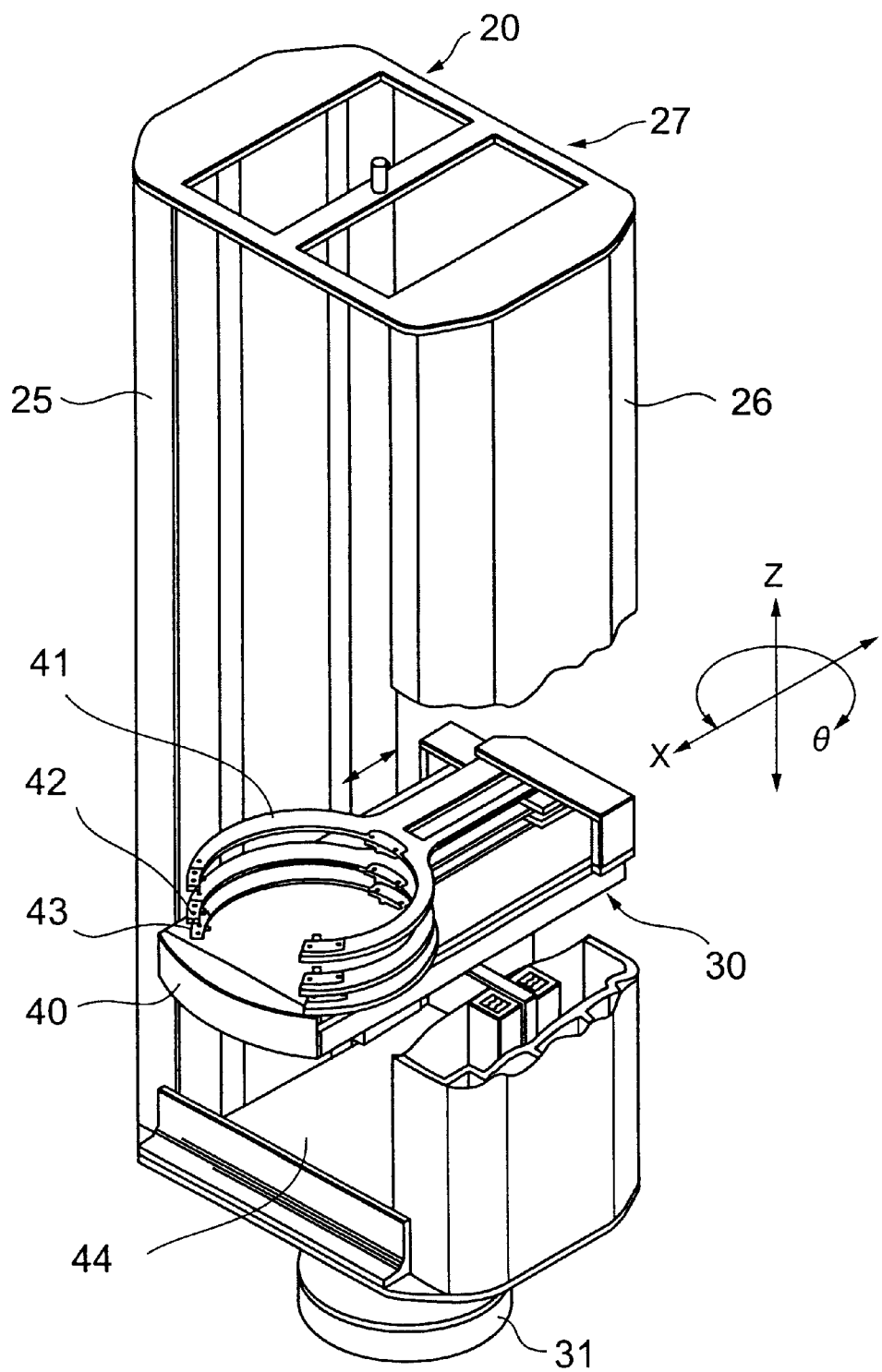
FIG. 4 is a perspective view of a main wafer transport mechanism shown in the SOD processing system in FIG. 1.

FIG. 4 is a perspective view showing an appearance of the main wafer transport mechanism 22, which is provided with a wafer transporter 30 ascendable and descendable in the vertical direction (the Z-direction) inside a cylindrical supporter 27 composed of a pair of wall portions 25 and 26 connected to each other at their upper ends and lower ends and face each other. The cylindrical supporter 27 is connected to a rotation shaft of a motor 31, and rotates integrally with the wafer transporter 30 around the rotation shaft by rotational driving force of the motor 31. Accordingly, the wafer transporter 30 is rotatable in the θ-direction. For example, three tweezers are provided on a transport base 40 of the wafer transporter 30. Each of the tweezers 41, 42, and 43 has a shape and a size capable of freely passing through a side opening 44 between both the wall portions 25 and 26 of the cylindrical supporter 27 to be movable back and forth in the X-direction. The main wafer transport mechanism 22 allows the tweezers 41, 42, and 43 to get access to the processing stations disposed therearound to transfer the wafer W to/from the processing stations.

Figure 5:
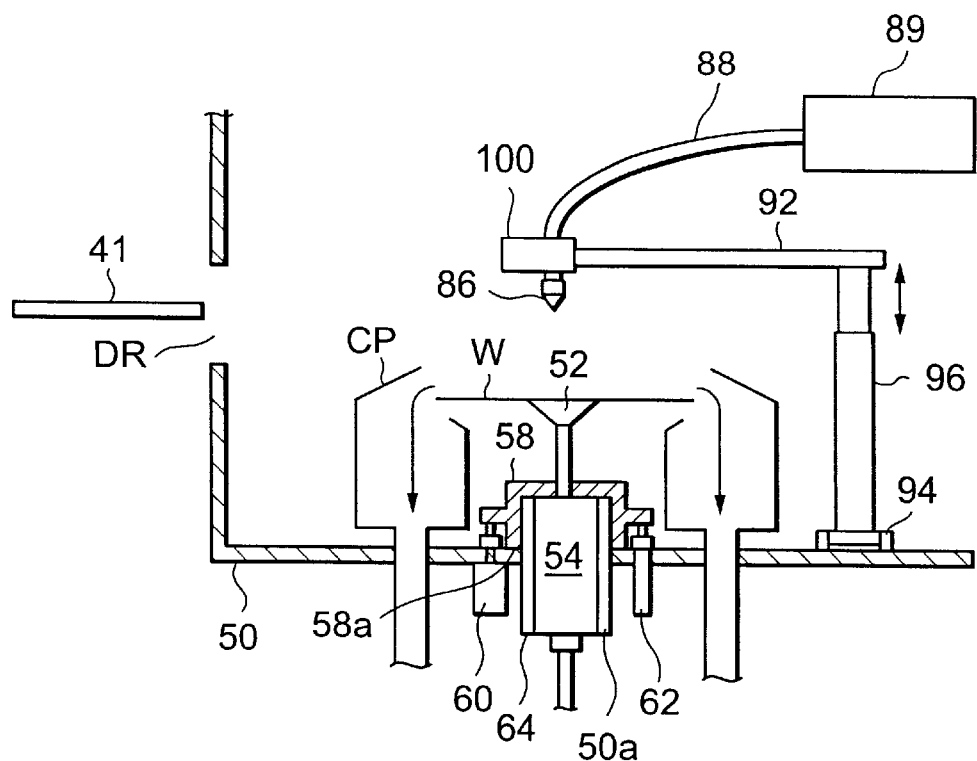
FIG. 5 is a front view of an SOD coating processing station shown in FIG. 2.
Figure 6:
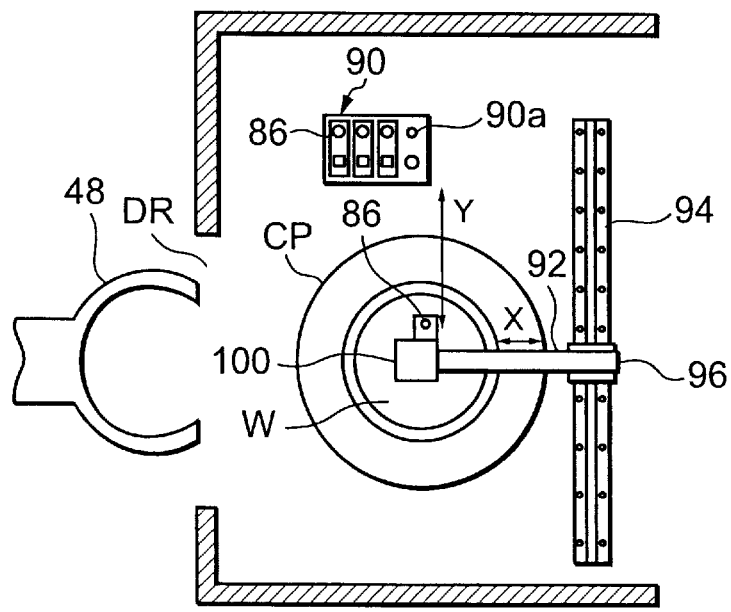
FIG. 6 is a plan view of the SOD coating processing station shown in FIG. 5.

The SOD coating processing station (SCT) will be explained next. FIG. 5 and FIG. 6 are a schematic sectional view and a schematic plan view showing the entire configuration of the SOD coating processing station (SCT).

At the center of the SOD coating processing station (SCT) an annular cup CP is disposed, and a spin chuck 52 is disposed inside the cup CP. The spin chuck 52 is rotationally driven by a driving motor 54 with securely holding the wafer W by vacuum suction. The driving motor 54 is disposed to be ascendable and descendable in an opening 50a provided in a unit bottom plate 50 and is coupled with a raising and lowering driver 60 and a raising and lowering guide portion 62 each of which is composed of, for example, an air cylinder through a cap-shaped flange member 58 made of, for example, aluminum. A cylindrical cooling jacket 64 composed of, for example, SUS is attached to a side face of the driving motor 54 and the flange member 58 is attached to cover the upper half portion of the cooling jacket 64.

During application of the insulating film material, a lower end 58a of the flange member 58 is in close contact with the unit bottom plate 50 near the outer periphery of the opening 50a, thereby enclosing the inside of the unit. When the wafer W is transferred between the spin chuck 52 and the tweezers 41 (42, 43) of the main wafer transport mechanism 22, the raising and lowering driver 60 lifts up the driving motor 54 and the spin chuck 52, whereby the lower end of the flange member 58 rises up from the unit bottom plate 50.

A nozzle 86 for supplying the insulating film material to the front face of the wafer W is connected to an insulating film material supply portion 89 through a supply pipe 88. The nozzle 86 is detachably attached to the tip of a nozzle scan arm 92 through a nozzle holder 100. The nozzle scan arm 92, attached to the upper end of a vertical support member 96 which is horizontally movable on a guide rail 94 laid in one direction (the Y-direction) on the unit bottom plate 50, is moved in the Y-direction integrally with the vertical support member 96 by a not shown Y-direction driving mechanism.

Further, the nozzle scan arm 92 is movable also in the X-direction orthogonal to the Y-direction to attach selectively the nozzle 86 thereto at a nozzle waiting portion 90, and thus it moves in the X-direction by means of a not shown X-direction driving mechanism.

Furthermore, a discharge port of the nozzle 86 is inserted into a mouth 90a of a solvent atmosphere chamber at the nozzle waiting portion 90 to be exposed to an atmosphere of a solvent therein, thereby preventing the insulating film material at the tip of the nozzle from curing or deteriorating. Moreover, a plurality of nozzles 86 are provided, so that the nozzles are properly used, for example, in accordance with the kind of the insulating film material. The nozzles 86 are attached so that the discharge ports thereof position on a line along the Y-moving direction of the nozzle scan arm 92.

Figure 7:
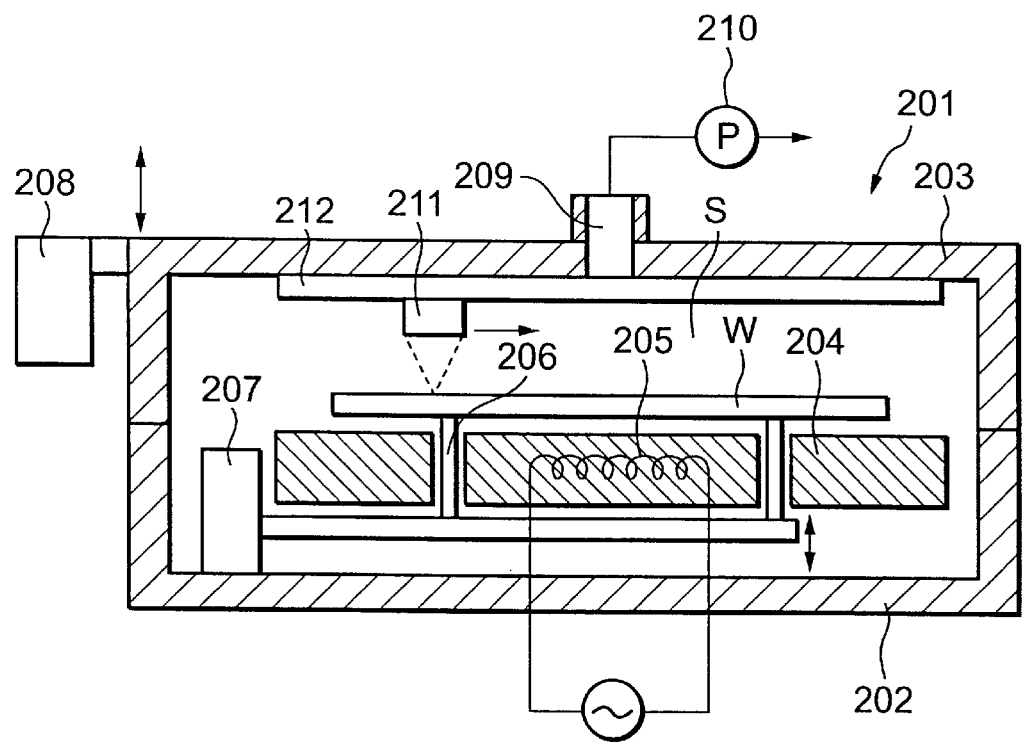
FIG. 7 is a front view of a reduced pressure drying station shown in FIG. 2.

The reduced pressure drying station (DCD) will be explained next. FIG. 7 is a sectional view showing the configuration of the reduced pressure drying station (DCD).

A chamber 201 as a processing chamber is composed of a base 202 and a lid body 203 in combination.

A hot plate 204 is disposed on the base 202. In the hot plate 204, a heater 205 is disposed, which sets the hot plate 204 to a desired temperature.

A plurality of, for example, three raising and lowering pins 206 can protrude and retract from the front face of the hot plate 204 by a raising and lowering mechanism 207 disposed on the rear face side of the hot plate 204. The wafer W is transported to/from the main wafer transport mechanism 22 with the raising and lowering pins 206 protruding from the front face of the hot plate 204.

The lid body 203 is disposed to be ascendable and descendable by a raising and lowering mechanism 208. The lid body 203 is lowered to thereby form a closed space S between the base 202 and the lid body 203.

The lid body 203 is provided with an exhaust port 209, through which the inside of the closed space S is exhausted by a vacuum pump 210 to be brought to a state close to a vacuum, for example, about 0.05 Torr to about 1 Torr.

Figure 8:
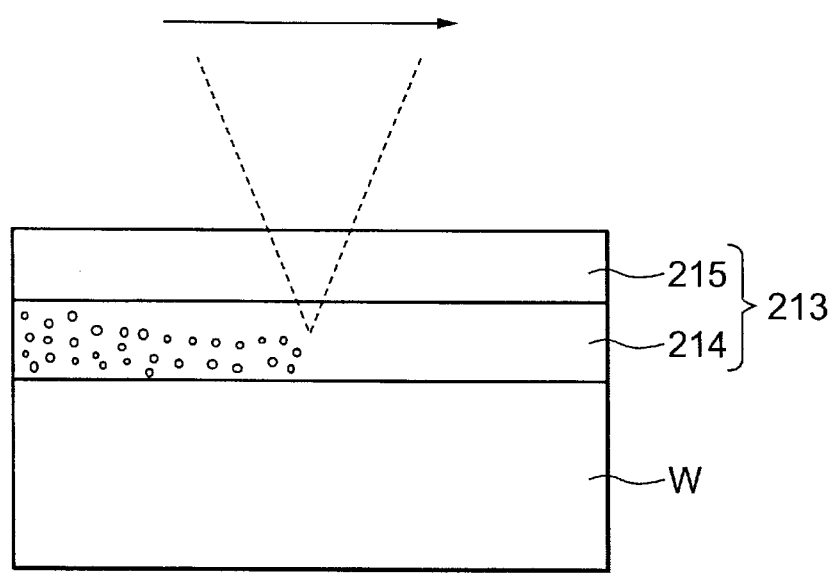
FIG. 8 is a view for explaining operations of an EB unit shown in FIG. 7.

On the rear face of the lid body 203, arranged are an EB unit 211 for irradiating the wafer W placed on the hot plate 204 with an electron beam, and a scanning mechanism 212 for scanning the EB unit to irradiate the entire face of the wafer W with the electron beam radiated from the EB unit 211. The scanning mechanism 212, provided for the EB unit 211, may be one for moving the EB unit 211 in one direction, or may be one for moving in the X- and Y-directions. The EB unit 211, as shown in FIG. 8, intensively irradiates a lower layer portion 214 out of the lower layer portion 214 and a upper layer portion 215 of an insulating film material 213 applied on the wafer W with an electron beam to thereby foam intensively the lower layer portion 214.

Figure 9:
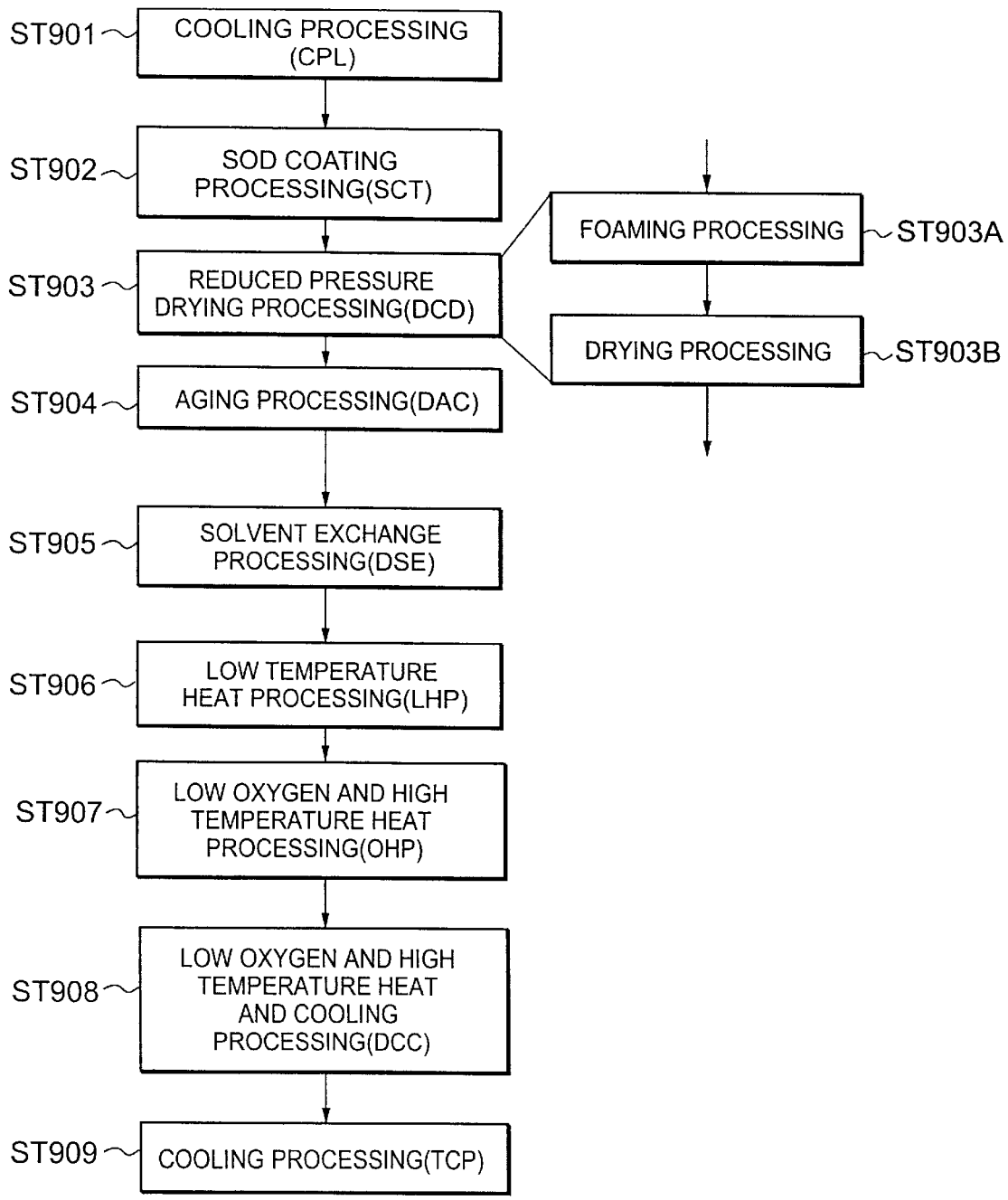
FIG. 9 is a processing flow chart of the SOD processing system shown in FIG. 1.

Operations in the above-structured SOD system 1 will be explained next. FIG. 9 shows a processing flow in the SOD system 1.

In the cassette block 10, an unprocessed wafer W is transported from the wafer cassette CR through the wafer carrier 21 to a transfer table in the transfer and cooling plate (TCP) included in the third group G3 on the processing block 11 side.

The wafer W transported to the transfer table in the transfer and cooling plate (TCP) is transported to the cooling processing station (CPL) via the main wafer transport mechanism 22. In the cooling processing station (CPL), the wafer W is cooled to a temperature suitable for the processing in the SOD coating processing station (SCT) (step 901).

The wafer W which has been subjected to the cooling processing in the cooling processing station (CPL) is transported to the SOD coating processing station (SCT) via the main wafer transport mechanism 22. The wafer W is then subjected to SOD coating processing in the SOD coating processing station (SCT) (step 902).

The wafer W which has been subjected to the SOD coating processing in the SOD coating processing station (SCT) is transported to the reduced pressure drying station (DCD) via the main wafer transport mechanism 22 and is subjected to reduced pressure drying processing (step 903).

In the reduced pressure drying station (DCD), the wafer W coated with the insulating film material by the SOD coating processing station (SCT) is first mounted on the hot plate 204 via the main wafer transport mechanism 22. Then, the closed space S is formed, and this closed space is brought to a vacuum state. In this state, the EB unit 211 irradiates the wafer W mounted on the hot plate 204 with an electron beam, whereby the insulating film material foams (step 903A). Subsequently, the hot plate 204 is raised to a predetermined temperature, and drying processing is performed under a reduced pressure (step 903B). Incidentally, the steps 903A and 903B may be performed almost at the same time.

Figure 10:
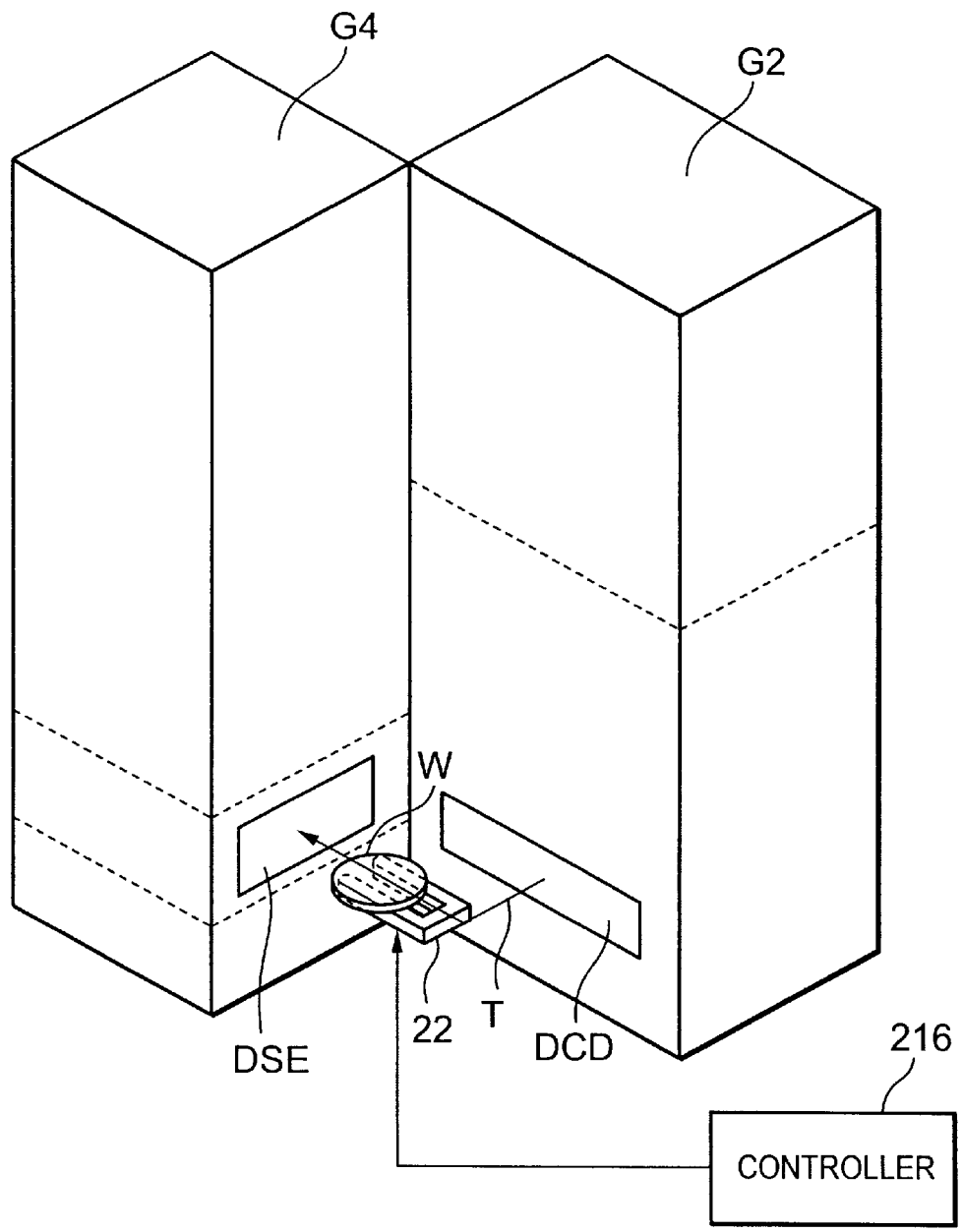
FIG. 10 is a schematic perspective view for explaining transport control in the present invention.

The wafer W which has been subjected to the drying processing in the reduced pressure drying station (DCD) is transported to the aging processing station (DAC) via the main wafer transport mechanism 22. In this event, as shown in FIG. 10, a controller 216 is controlling transport by the main wafer transport mechanism 22 to keep constant a period of time T required for the wafer W to be transported from the reduced pressure drying station (DCD) to the aging processing station (DAC). This can suppress variation in dielectric constant and in film thickness.

In the aging processing station (DAC), the wafer W is subjected to aging processing with $NH_3+H_2O$ introduced into the processing chamber to thereby gelatinize the insulating film material film on the wafer W (step 904).

The wafer W which has been subjected to the aging processing in the aging processing station (DAC) is transported to the solvent exchange processing station (DSE) via the main wafer transport mechanism 22. Then, in the solvent exchange processing station (DSE), the wafer W is supplied with an exchange chemical, whereby processing of exchanging the solvent in the insulating film applied on the wafer for another solvent is performed (step 905).

The wafer W which has been subjected to the exchange processing in the solvent exchange processing station (DSE) is transported to the low temperature heat processing station (LHP) via the main wafer transport mechanism 22. The wafer W is then subjected to low temperature heat processing in the low temperature heat processing station (LHP) (step 906). The low temperature heat processing may be, of course, performed in a low oxygen atmosphere or under a reduced pressure.

The wafer W which has been subjected to the low temperature heat processing in the low temperature heat processing station (LHP) is transported to the low oxygen and high temperature heat processing station (OHP) via the main wafer transport mechanism 22. In the low oxygen and high temperature heat processing station (OHP), the wafer W is then subjected to high temperature heat processing in a low oxygen atmosphere (step 907).

The wafer W which has been subjected to the high temperature heat processing in the low oxygen and high temperature heat processing station (OHP) is transported to the low oxygen cure and cooling processing station (DCC) via the main wafer transport mechanism 22. Then, the wafer W is subjected to high temperature heat processing and then to cooling processing in a low oxygen atmosphere in the low oxygen cure and cooling processing station (DCC) (step 908).

The wafer W which has been processed in the low oxygen cure and cooling processing station (DCC) is transported to the cooling plate in the transfer and cooling plate (TCP) via the main wafer transport mechanism 22. The wafer W is then subjected to cooling processing on the cooling plate in the transfer and cooling plate (TCP) (step 909).

The wafer W which has been subjected to the cooling processing on the cooling plate in the transfer and cooling plate (TCP) is transported to the wafer cassette CR via the wafer carrier 21 in the cassette block 10.

Figure 15:
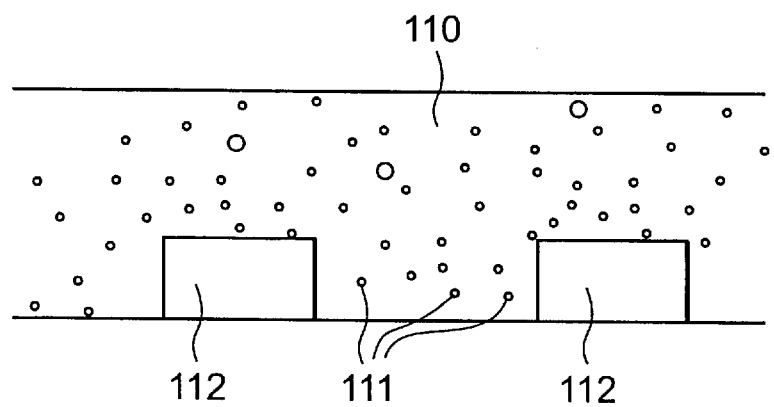
FIG. 15 is a view for explaining effects of the present invention.

In this embodiment, since the foaming processing is performed in the reduced pressure drying station (DCD), bubbles 111 remain in an insulating film 110 as shown in FIG. 15, and the existence of the bubbles 111 can decrease the relative dielectric constant. Further, the performance of the foaming and the drying under the reduced pressure prevents collapse of the bubbles 111 occurring in the insulating film 110. Accordingly, a capacitance between wirings 112 formed in the same layer can be decreased. Furthermore, the foaming processing is performed so that the lower layer portion in the insulating film 110 intensively foams, and therefore there is no bubble on the front face, facilitating the application of, for example, the Damascene method.

The Damascene method is disclosed by Damascene Integration of Copper and Ultra-Low-k Xerorgel for High Performance Interconnects; E. M. Zielinski, S. W. Russell, R. S. List, A. M. Wilson, C. Jin, K. J. Newton, J. P. Lu, T. Hurd, W. Y. Hsu, V. Cordasco, M. Gopikanth, V. Korthuis, W. Lee, G. Cerny, N. M. Russell, P. B. Smith, S. O'Brien, and R. H. Havemann Semiconductor Process and Device Center, Texas Instruments, P.O. Box 650311. MS 3702, Dallas, Tex. 75265,(972)995-5261.

Figure 11:
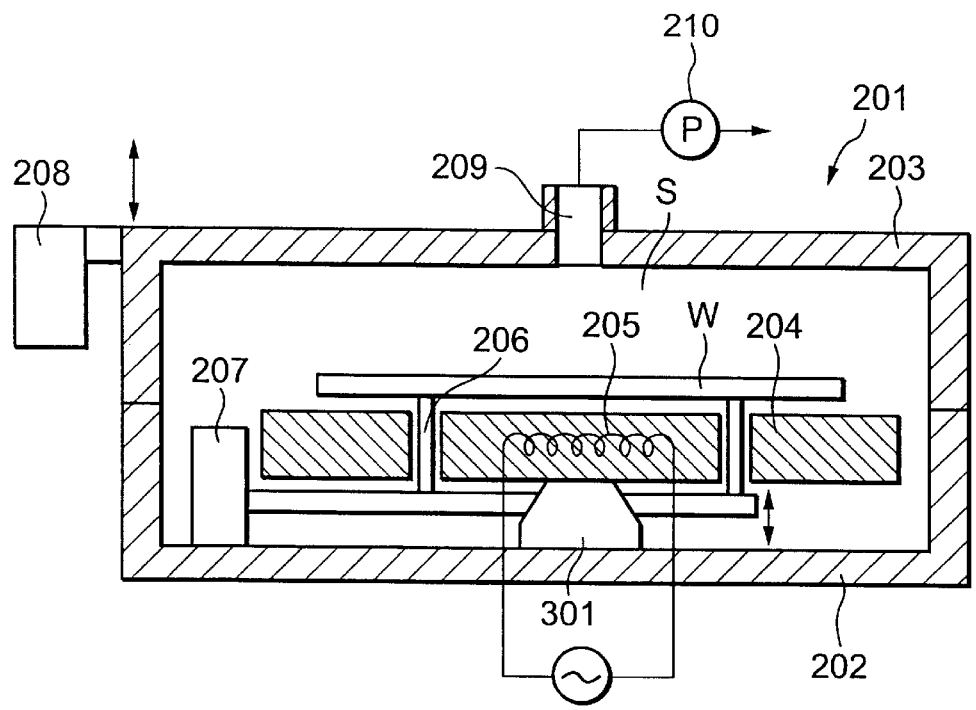
FIG. 11 is a front view of a reduced pressure drying station according to another embodiment of the present invention.
Figure 12:
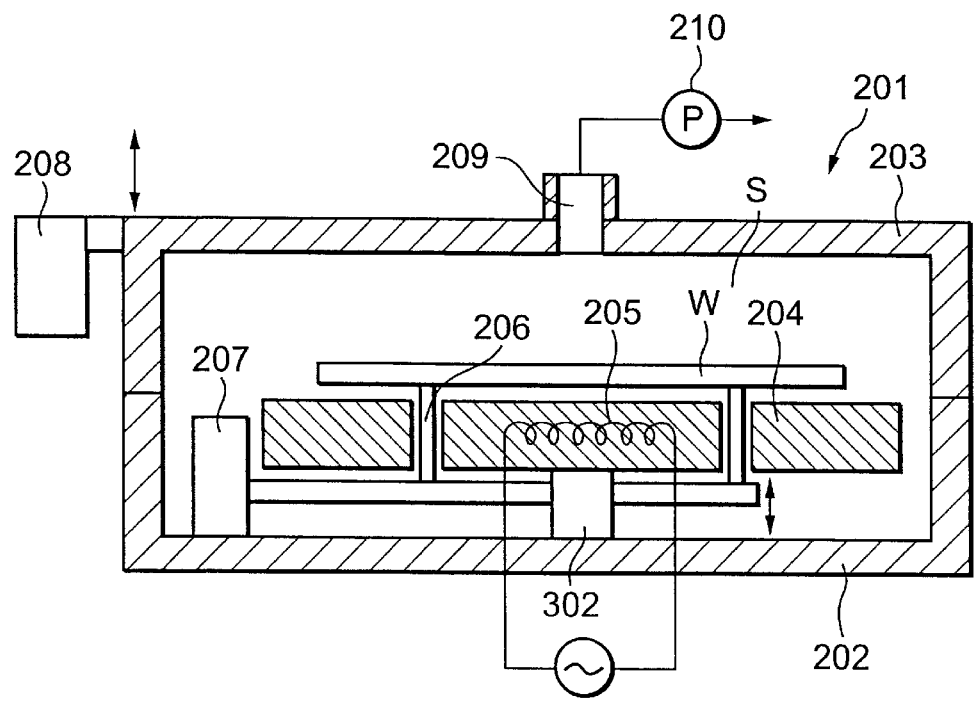
FIG. 12 is a front view of a reduced pressure drying station according to still another embodiment of the present invention.
Figure 13:
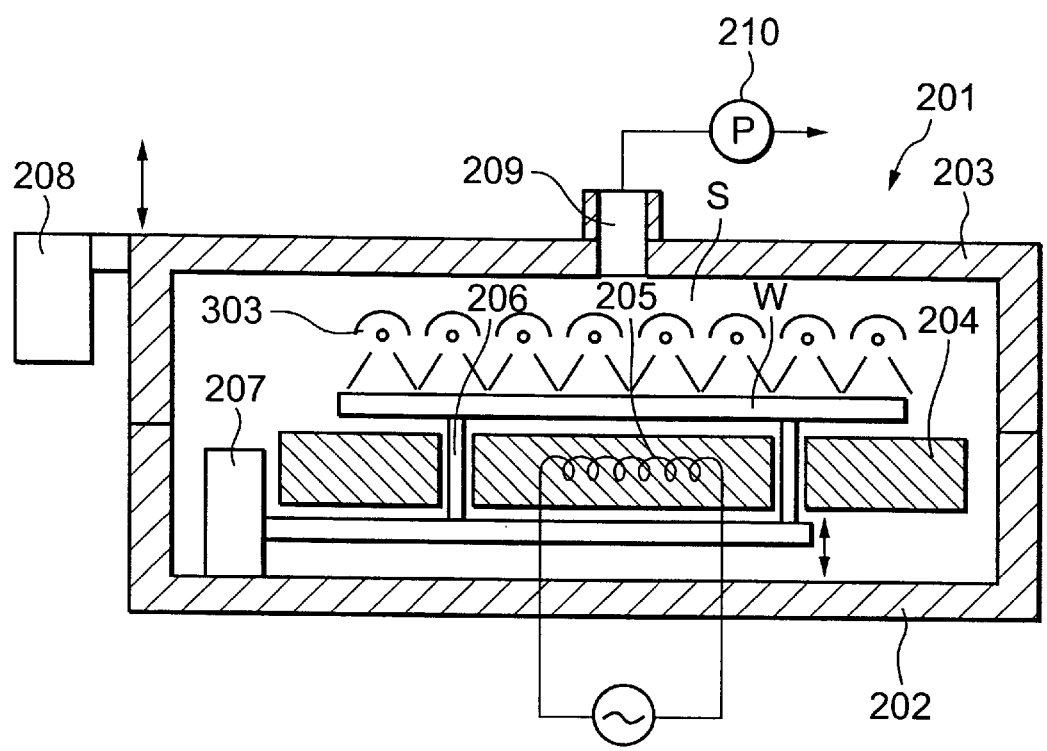
FIG. 13 is a front view of a reduced pressure drying station according to yet another embodiment of the present invention.

In the above-described embodiment, the foaming processing in the reduced pressure drying station (DCD) is performed by the use of the electron beam, but, as shown in FIG. 11, an ultrasound generating device 301 is attached to the hot plate 204 to supply ultrasound to the insulating film material on the wafer W through the hot plate 204, thereby also performing the foaming processing. Alternatively, as shown in FIG. 12, a vibration generating device 302 is attached to the hot plate 204 to impart vibration to the insulating film material on the wafer W through the hot plate 204, thereby also performing the foaming processing. Further, as shown in FIG. 13, infrared lamps 303 for irradiating the wafer W with infrared rays are provided above the hot plate 204 to irradiate the insulating film material on the wafer W on the hot plate 204 with infrared rays, thereby also performing the foaming processing. In this case, the infrared lamps 303 can also serve as portion for baking the front face of the insulating film material during drying to thereby cure the front face, facilitating the application of, for example, the damascene method.

Incidentally, the present invention is not limited to the above-described embodiment, but various modifications are possible.

For example, gas with a dielectric constant lower than that of the insulating film material is previously dissolved in the insulating film material, and the gas may be manifested as bubbles under the reduced pressure during the aforesaid drying. Thus, the bubbles, in addition to the aforesaid vacuum bubbles, can also decrease the relative dielectric constant of the insulating film.

Figure 14:
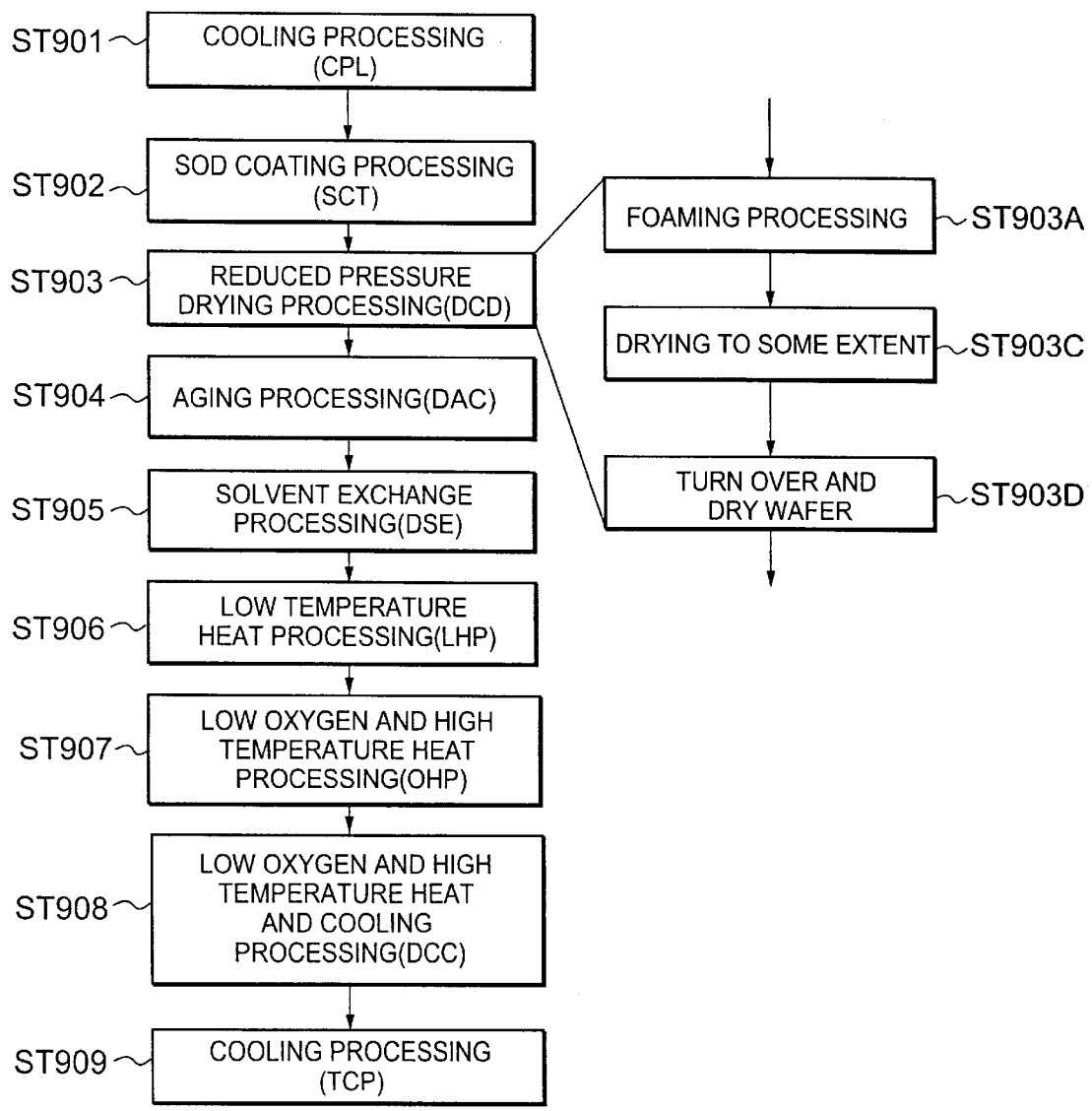
FIG. 14 is another processing flow chart of the SOD processing system according to the present invention.

Moreover, as shown in FIG. 14, when the wafer W is subjected to the drying processing in the reduced pressure drying station (DCD), the drying may be performed to a degree at which fluidity of the insulating film material can be kept to some extent (step 903C), and thereafter the wafer W may be turned over and dried (step 903D). When the wafer W is turned over, the bubbles float upward, resulting in concentration of the bubbles in the insulating film between the wirings. This can decrease the relative dielectric constant of the insulating film, and can cure the front face thereof without bubbles, thereby facilitating the application of, for example, the Damascene method.

The present invention is not limited to the above-described embodiments, but various modifications are possible. For example, the substrate to be processed is not limited to a semiconductor wafer, but other substrates such as an LCD substrate and the like. Moreover, the kind of film is not limited to the layer insulating film.

As has been described, the vacuum bubbles remain in the insulating film, thereby decreasing the relative dielectric constant, and the drying is performed under a reduced pressure, avoiding collapse of the bubbles occurring in the aforesaid insulating film. Thus, the relative dielectric constant of the layer insulating film can be further decreased.

Additional advantages and modifications will readily occur to those skilled in the art. Therefore, the invention in its broader aspects is not limited to the specific details and representative embodiments shown and described herein. Accordingly, various modifications maybe made without departing from the spirit or scope of the general inventive concept as defined by the appended claims and their equivalents.

What is claimed is:

1. A coating apparatus, comprising:

a first processing chamber having a rotatable supporter for rotating a substrate while holding it, and a supplier for supplying an insulating film material onto the substrate held by the rotatable supporter;

a foaming mechanism for foaming the insulating film material supplied on the substrate under a reduced pressure;

a second processing chamber for drying the insulating film material on the substrate; and a transporter for transporting the substrate from the first processing chamber to the second processing chamber.

2. The apparatus according to claim 1, wherein the foaming mechanism is provided in the second processing chamber.

3. The apparatus according to claim 1, wherein the foaming mechanism has an ultrasound supply mechanism for supplying an ultrasound to the insulating film material.

4. The apparatus according to claim 1, wherein the foaming mechanism has a vibration supply mechanism for supplying a vibration to the insulating film material.

5. The apparatus according to claim 1, wherein the foaming mechanism has an infrared ray lamp for irradiating the insulating film material with an infrared ray.

6. The apparatus according to claim 1, wherein the foaming mechanism has an electron beam irradiation mechanism for irradiating the insulating film material with an electron beam.

7. The apparatus according to claim 6, wherein the insulating film material applied on the substrate has an upper layer portion and a lower layer portion, and wherein the electron beam irradiation mechanism intensively irradiates the lower layer portion.

8. The apparatus according to claim 1, further comprising:

a third processing chamber for performing heat processing for the substrate at a high temperature;

wherein the transporter transports the substrate from the second processing chamber to the third processing chamber, and wherein the coating apparatus further comprises a controller for controlling the transporter to keep constant a period of time required to transport the substrate from the second processing chamber to the third processing chamber.

9. The coating apparatus, comprising:

a first processing chamber having a rotatable supporter for rotating a substrate while holding it, and a supplier for supplying an insulating film material onto the substrate held by the rotatable supporter;

a second processing chamber for drying the substrate under a reduced pressure while an ultrasound is supplied to the insulating film material on the substrate; and a transporter for transporting the substrate from the first processing chamber to the second processing chamber.

10. The apparatus according to claim 9, wherein the second processing chamber further comprises a mechanism for turning over the substrate.

11. The apparatus according to claim 9, wherein the insulating film material applied on the substrate has a front face; and wherein the second processing chamber further comprises a baking unit for baking the front face of the insulating film material applied on the substrate.

* * * * *